US012635249B2

(12) United States Patent　　(10) Patent No.: US 12,635,249 B2
Haraguchi et al.　　　　　　　　(45) Date of Patent: May 19, 2026

(54) DISPLAY DEVICE

(71) Applicant: KYOCERA Corporation, Kyoto (JP)

(72) Inventors: Fumiaki Haraguchi, Yasu (JP);
Hiroaki Ito, Ritto (JP); Nobuyuki Hasegawa, Sanda (JP)

(73) Assignee: KYOCERA Corporation, Kyoto (JP)

( * ) Notice: Subject to any disclaimer, the term of this patent is extended or adjusted under 35 U.S.C. 154(b) by 424 days.

(21) Appl. No.: 18/283,911

(22) PCT Filed: Mar. 3, 2022

(86) PCT No.: PCT/JP2022/009048
§ 371 (c)(1),
(2) Date: Sep. 25, 2023

(87) PCT Pub. No.: WO2022/202175
PCT Pub. Date: Sep. 29, 2022

(65) Prior Publication Data
US 2024/0170498 A1　　May 23, 2024

(30) Foreign Application Priority Data
Mar. 26, 2021　(JP) ................................. 2021-054051

(51) Int. Cl.
　　*H10D 86/60*　　(2025.01)
　　*H01L 25/16*　　(2023.01)
　　*H10D 86/40*　　(2025.01)
(52) U.S. Cl.
　　CPC ........... *H10D 86/60* (2025.01); *H01L 25/167* (2013.01); *H10D 86/441* (2025.01)

(58) Field of Classification Search
　　CPC ..... H01L 25/16; H01L 25/167; H10H 20/857; H10D 86/40; H10D 86/441; H10D 86/60; G02F 1/00; G09F 9/00; G09F 9/30; G09F 9/33; G09F 11/00; G06C 1/00; G06G 1/00
　　See application file for complete search history.

(56) References Cited

U.S. PATENT DOCUMENTS

2008/0284315 A1　11/2008　Tasumi et al.
2009/0122653 A1　5/2009　Seki et al.
2016/0095184 A1*　3/2016　Nakabayashi ......... H05B 33/22
　　　　　　　　　　　　　　　　　　　　313/503

(Continued)

FOREIGN PATENT DOCUMENTS

CN　　　101430473 A　　5/2009
JP　　2009-115686 A　　5/2009
　　　　(Continued)

*Primary Examiner* — Brook Kebede
(74) *Attorney, Agent, or Firm* — Procopio, Cory, Hargreaves & Savitch LLP

(57) ABSTRACT

A display device includes a substrate including a first surface and a second surface opposite to the first surface, a display on the first surface, a first wiring pad located on the second surface and electrically connected to the display, an external connection terminal on the second surface, connection wiring located on the second surface and electrically connecting the first wiring pad and the external connection terminal, and a dummy conductor being a protrusion on the second surface. The protrusion overlaps none of the first wiring pad, the external connection terminal, and the connection wiring in a plan view.

17 Claims, 13 Drawing Sheets

(56) References Cited

U.S. PATENT DOCUMENTS

2016/0118548 A1* 4/2016 Kawaguchi ......... H01L 25/0753
257/88
2024/0170498 A1 5/2024 Haraguchi et al.

FOREIGN PATENT DOCUMENTS

| JP | 2009-231785 A | 10/2009 |
| JP | 2009-274447 A | 11/2009 |
| JP | 2011-9789 A | 1/2011 |
| JP | 7571282 B2 | 10/2024 |

* cited by examiner

DISPLAY DEVICE

TECHNICAL FIELD

The present disclosure relates to a display device includ-ing light emitters such as light-emitting diodes (LEDs).

BACKGROUND OF INVENTION

Known display devices are described in, for example, Patent Literatures 1 and 2.

CITATION LIST

Patent Literature

Patent Literature 1: Japanese Unexamined Patent Appli-cation Publication No. 2011-9789
Patent Literature 2: Japanese Unexamined Patent Appli-cation Publication No. 2009-231785

SUMMARY

In an aspect of the present disclosure, a display device includes a substrate including a first surface and a second surface opposite to the first surface, a display on the first surface, a first wiring pad located on the second surface and electrically connected to the display, an external connection terminal on the second surface, connection wiring located on the second surface and electrically connecting the first wiring pad and the external connection terminal, and a protrusion on the second surface. The protrusion overlaps none of the first wiring pad, the external connection termi-nal, and the connection wiring in a plan view.

BRIEF DESCRIPTION OF THE DRAWINGS

The objects, features, and advantages of the present disclosure will become more apparent from the following detailed description and the drawings.

DESCRIPTION OF EMBODIMENTS

The structure that forms the basis of a display device according to one or more embodiments of the present disclosure will now be described. Patent Literatures 1 and 2 each describe a light-emitting diode (LED) display device including multiple LEDs. A method for manufacturing an LED display device includes mounting multiple LEDs on a substrate. In the mounting process, a substrate including multiple mounting portions on its one main surface is first placed on a flat stage surface of a mounting apparatus with the other main surface facing the stage surface. Subse-quently, the LEDs are placed on the respective mounting portions with a conductive bond such as an anisotropic conductive film (ACF). With the conductive bond being heated, the LEDs are then pressed against the substrate to electrically connect the electrodes of each LED and elec-trode pads in the mounting portions.

In a known LED display device, a substrate includes the other main surface that is less flat. Thus, multiple LEDs pressed against the substrate may not be uniformly pressed at a predetermined pressure. The substrate may have defor-mation such as bending when the LEDs are pressed against the substrate. The LEDs may not be uniformly pressed at a predetermined pressure. This may cause defective mounting of the LEDs and lower the image quality and the manufac-turing yield of the LED display device.

The display device according to one or more embodi-ments of the present disclosure will now be described with reference to the accompanying drawings. Each FIG. referred to below illustrates main components and other elements of the display device according to one or more embodiments. In the present embodiment, the display device may include known components that are not illustrated, for example, circuit boards, wiring conductors, control integrated circuits (ICs), and control LSI circuits. Each figure referred to below is also schematic and is not drawn to scale relative to, for example, the actual positions and dimensional ratios of components of the display device.

Figure 1:
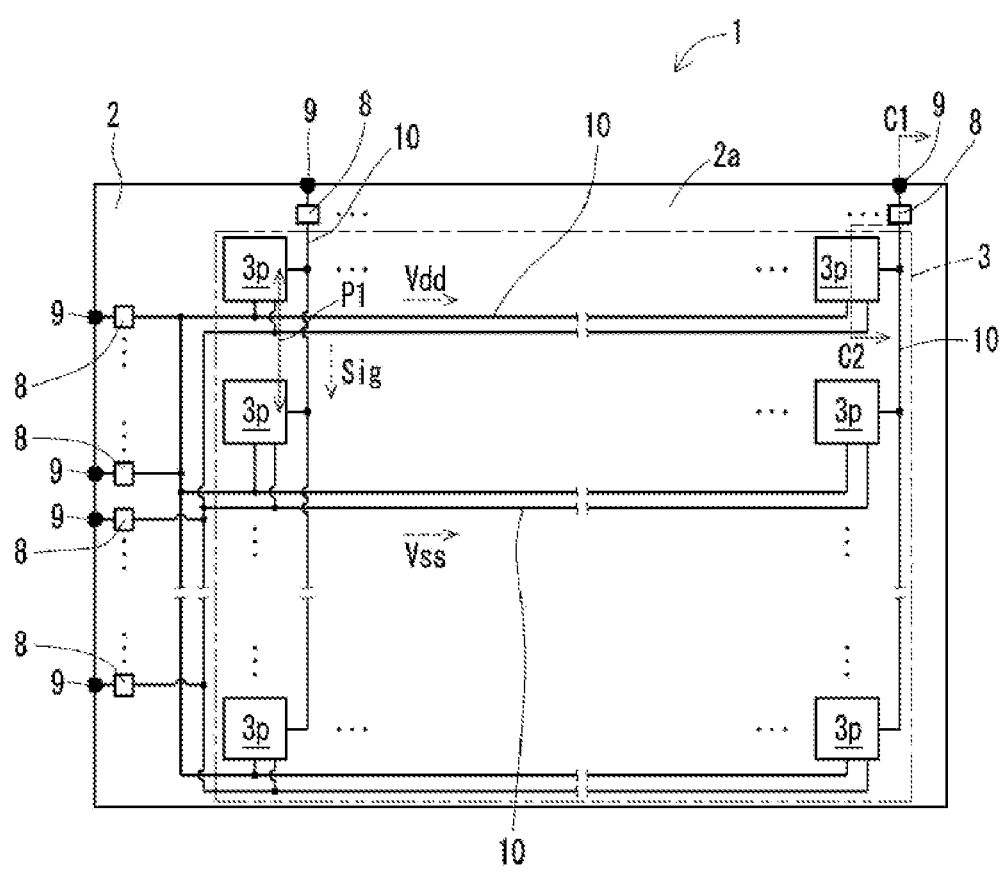
FIG. 1 is a schematic plan view of a display device according to an embodiment of the present disclosure, illustrating its circuit structure on a first surface of a sub-strate.
Figure 2:
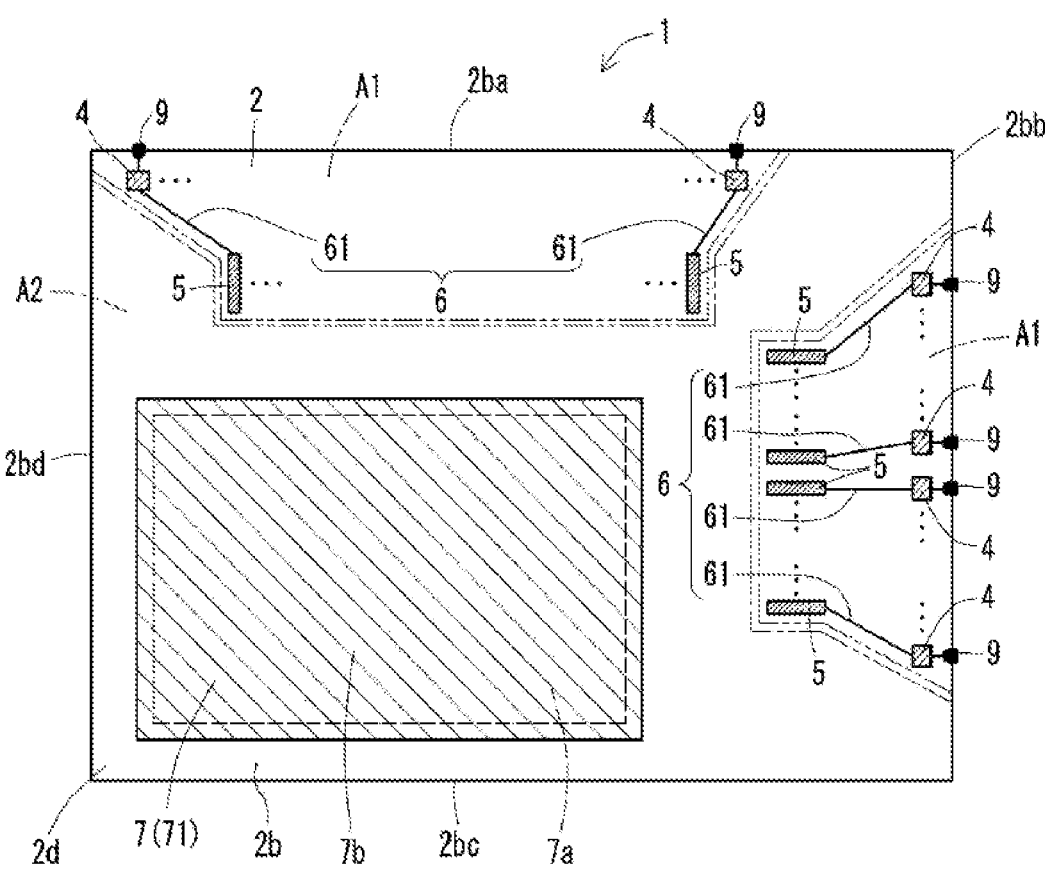
FIG. 2 is a schematic plan view of the display device according to the embodiment of the present disclosure, illustrating its circuit structure on a second surface of the substrate.
Figure 3:
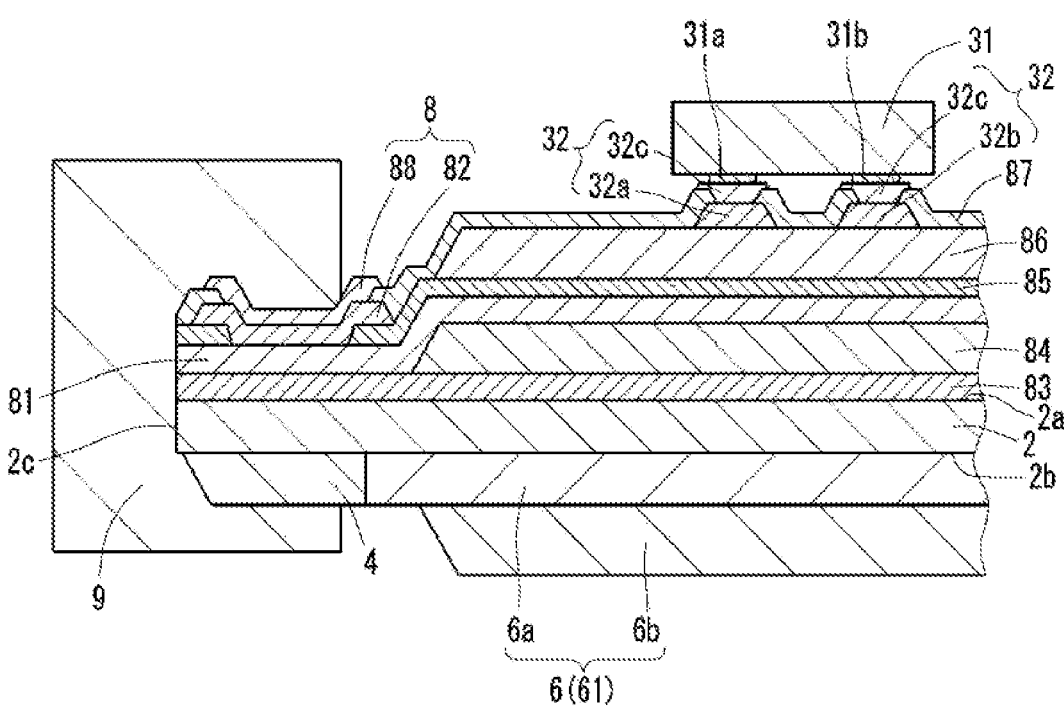
FIG. 3 is a partial cross-sectional view of the display device according to the embodiment of the present disclo-sure, illustrating its portion including an edge area of the substrate, taken along line C1-C2 in FIG. 1.

FIG. 1 is a schematic plan view of the display device according to one embodiment of the present disclosure, illustrating its circuit structure on a first surface of a substrate. FIG. 2 is a schematic plan view of the display device according to the embodiment of the present disclosure, illustrating its circuit structure on a second surface of the substrate. FIG. 3 is a partial cross-sectional view of the display device according to the embodiment of the present disclosure, illustrating its portion including an edge area of the substrate. FIGS. 4 to 9 and FIGS. 11 to 13 are each a schematic plan view of a display device according to another embodiment of the present disclosure, illustrating its circuit structure on a second surface of a substrate. FIG. 10 is a graph showing the relationship between the interval between adjacent dummy conductors and the defective ratio of mounting of light emitters in the display device according to an example of the present disclosure. FIGS. 2, 4 to 9, and 11 to 13 each illustrate first wiring pads 4, external connection terminals 5, and a dummy conductor(s) 7 with hatching for ease of illustration.

In one or more embodiments of the present disclosure, a display device 1 includes a substrate 2, a display 3, the first wiring pads 4, the external connection terminals 5, connection wiring (also referred to as first connection wiring) 6, and the dummy conductor(s) 7 as a protrusion.

In one or more embodiments of the present disclosure, the display device 1 includes, as illustrated in FIG. 2, the substrate 2 including a first surface 2a and a second surface 2b opposite to the first surface 2a, the display 3 on the first surface 2a, the first wiring pads 4 on the second surface 2b electrically connected to the display 3, the external connection terminals 5 on the second surface 2b, the connection wiring 6 on the second surface 2b electrically connecting the first wiring pads 4 and the external connection terminals 5, and the dummy conductor 7 on the second surface 2b. The dummy conductor 7 is a protrusion overlapping none of the first wiring pads 4, the external connection terminals 5, and the connection wiring 6 in a plan view.

In one or more embodiments of the present disclosure, the display device 1 with the above structure produces the effects described below. The display device 1 includes, on the second surface 2b of the substrate 2, the dummy conductor 7 overlapping none of the first wiring pads 4, the external connection terminals 5, and the connection wiring 6 in a plan view. This structure allows the second surface 2b of the substrate 2 to be flatter. Also, this structure improves the rigidity of the substrate 2 and thus reduces changes of the substrate 2 such as bending when the substrate 2 is pressed on the first surface 2a of the substrate 2 in the mounting process of light emitters 31. Thus, multiple light emitters 31 pressed against the substrate 2 in the mounting process can be easily pressed uniformly at a predetermined pressure. This can reduce defective mounting of the light emitters 31, thus improving the image quality and the manufacturing yield of the display device 1.

The protrusion may be made of, for example, a conductive material such as metal, a semiconductor material, an inorganic insulating material, or an organic insulating material. Examples of the conductive material may include Al, Al/Ti, Ti/Al/Ti, Mo, Mo/Al/Mo, MoNd/AlNd/MoNd, Cu, Cr, Ni, and Ag. For example, Al/Ti indicates a structure including a Ti layer stacked on an Al layer. Examples of the semiconductor material may include silicon, germanium, gallium arsenide, gallium phosphide, and indium phosphide. Examples of the inorganic insulating material may include silicon dioxide ($SiO_2$) and silicon nitride ($Si_3N_4$). Examples of the organic insulating material may include an acrylic resin, polycarbonate, and polyethylene terephthalate (PET). The protrusion may include at least a surface layer made of a material having a lower hardness than a hardness of the first wiring pads 4, a hardness of the external connection terminals 5, and a hardness of the connection wiring 6. In this structure, when the substrate 2 is pressed on its first surface 2a in the mounting process of the light emitters 31, the protrusion deforms and can easily serve as a cushion. To improve this function, the protrusion may include at least the surface layer made of the resin material described above. The protrusion may include the surface layer made of the resin material and a layer lower than the surface layer made of, for example, the conductive material such as metal and the semiconductor material described above. The resin material may be elastic. Examples of the elastic resin material include a silicone resin, a urethane resin, a porous urethane resin (urethane foam), and an acrylic resin. The thickness of the surface layer of the protrusion may be, but not limited to, about 5 to 50% inclusive of the height of the protrusion. The protrusion may also be made of the same conductive material as, for example, the connection wiring 6. In this case, the protrusion may be formed in the same manufacturing process as, for example, the connection wiring 6. The protrusion as the dummy conductor 7 will be described below. The dummy conductor 7 may include a wiring portion and various conductor patterns.

Figure 4:
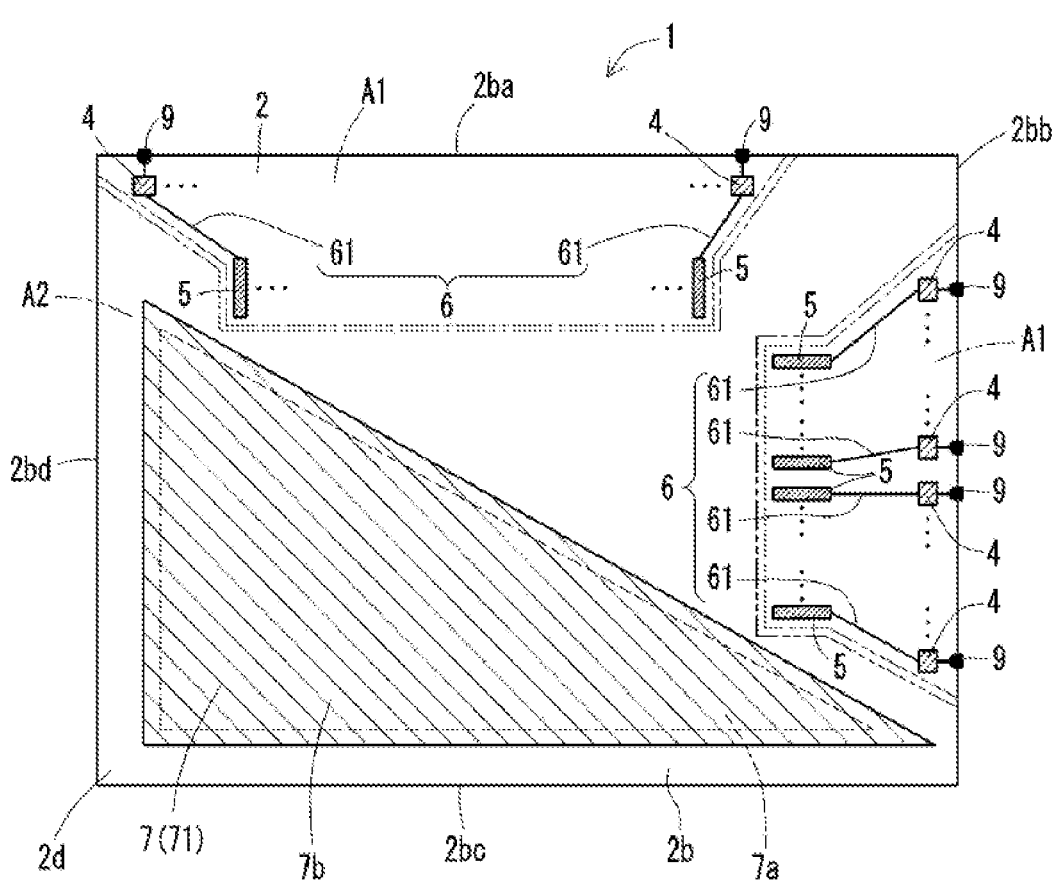
FIG. 4 is a schematic plan view of a display device according to another embodiment of the present disclosure, illustrating its circuit structure on a second surface of a substrate.

As illustrated in FIGS. 2 and 4, the substrate 2 includes, on the second surface 2b, a first portion A1 including the first wiring pads 4, the external connection terminals 5, and the connection wiring 6, and a second portion A2 other than the first portion A1. The dummy conductor 7 may be located in the second portion A2 and may have an area of at least a half of the area of the second portion A2. This structure allows the second surface 2b of the substrate 2 to be flatter. This structure also allows the substrate 2 to have higher rigidity. The dummy conductor 7 may have an area with a percentage of not less than 60% and less than 100% or about 70 to 95% of the area of the second portion A2. A range of values referred to herein as one value to another value intends to mean the two values being inclusive.

In the above structure, the dummy conductor 7 may include a solid portion. The dummy conductor 7 may be fully solid. This allows easy adjustment of the area of the dummy conductor 7 to more easily improve the rigidity of the substrate 2.

Figure 5:
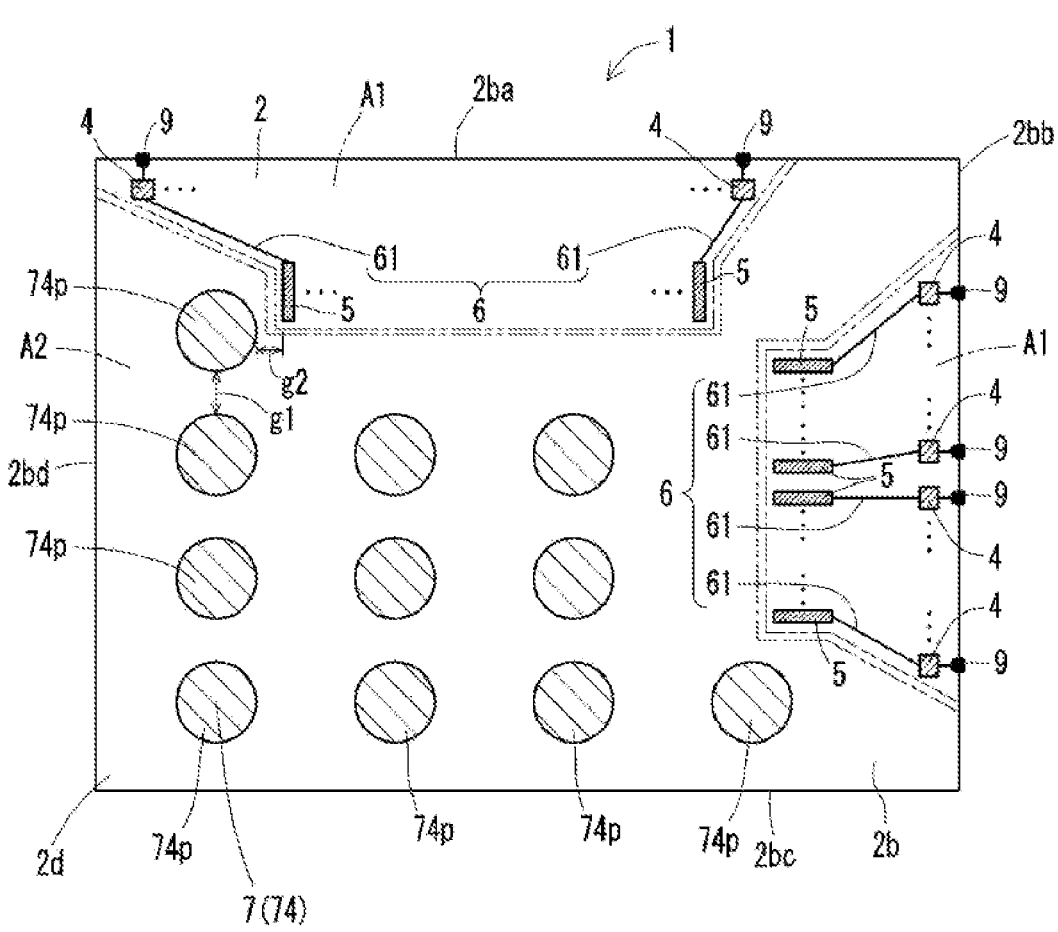
FIG. 5 is a schematic plan view of a display device according to another embodiment of the present disclosure, illustrating its circuit structure on a second surface of a substrate.
Figure 6:
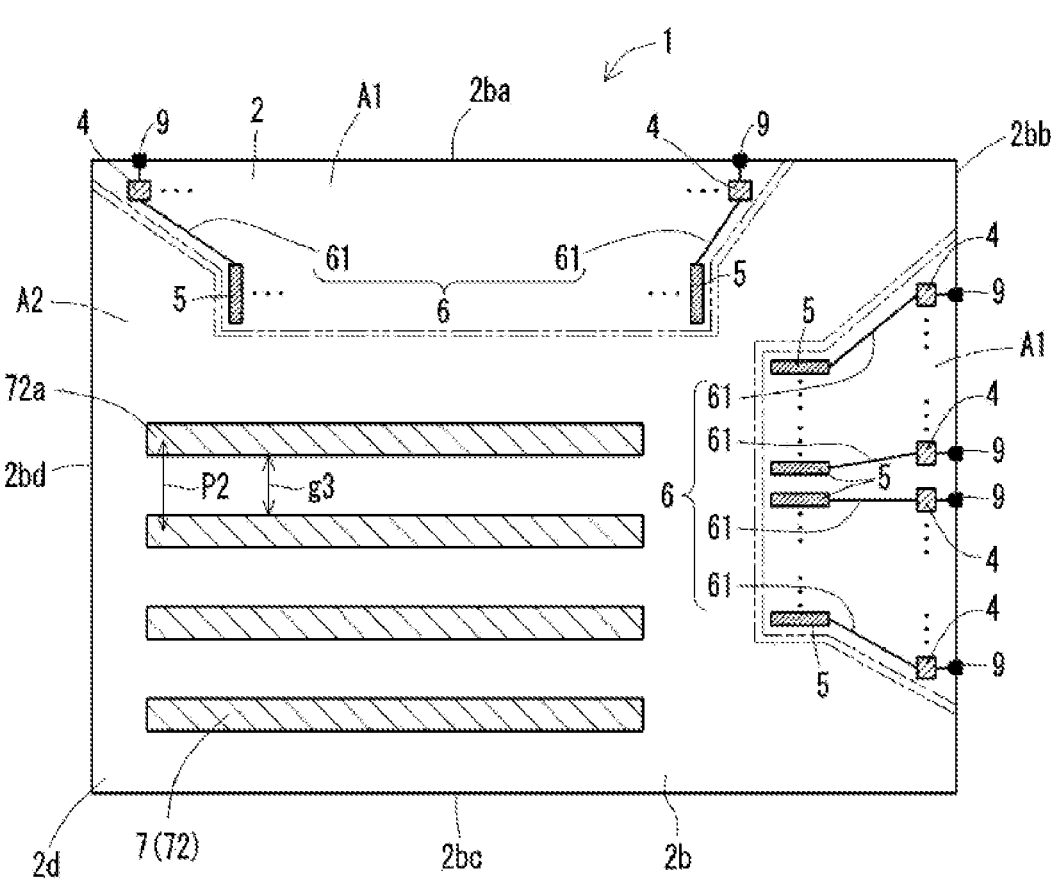
FIG. 6 is a schematic plan view of a display device according to another embodiment of the present disclosure, illustrating its circuit structure on a second surface of a substrate.

As illustrated in FIGS. 5 and 6, multiple dummy conductors 7 may be uniformly distributed in the second portion A2. These structures each allow the second surface 2b of the substrate 2 to be flatter. More specifically, for example, with the dummy conductor 7 being fully solid, the substrate 2 may easily have different rigidity values between an area including the dummy conductor 7 and an area including no dummy conductor 7. The substrate 2 thus easily bends in its natural state. With the dummy conductors 7 uniformly distributed in the second portion A2, the substrate 2 may have distributed rigidity values and thus is less likely to bend in its natural state. Also, this structure improves the rigidity of the substrate 2 uniformly across the substrate 2 and thus further reduces changes of the substrate 2 such as bending when the substrate 2 is pressed on the first surface 2a of the substrate 2 in the mounting process of the light emitters 31.

As illustrated in FIG. 5, adjacent dummy conductors 7 may be at an interval g1 of a predetermined value or less, and the connection wiring 6 and the closest dummy conductor 7 may be at an interval g2 of a predetermined value or less. In this case, the dummy conductors 7 are densely arranged in the second portion A2 of the second surface 2b of the substrate 2. This allows the second surface 2b of the substrate 2 to be flatter. This also improves the rigidity of the substrate 2 more uniformly across the second surface 2b, thus reducing bending of the substrate 2 in its natural state. This also improves the rigidity of the substrate 2 more uniformly across the substrate 2, thus further reducing changes of the substrate 2 such as bending when the substrate 2 is pressed on the first surface 2*a* in the mounting process of the light emitters 31. The above predetermined value may be about 6.5 mm as described below.

In one or more embodiments of the present disclosure, the display device 1 may include the dummy conductors 7 distributed across the second surface 2*b* of the substrate 2. In this case, the dummy conductors 7 may be located in portions between the first wiring pads 4, between the external connection terminals 5, and between the connection wiring 6. This structure allows the second surface 2*b* of the substrate 2 to be flatter. The substrate 2 can thus have more distributed rigidity values.

In the display device 1 according to one or more embodiments of the present disclosure, the percentage of the area (SR1) of the first wiring pads 4, the external connection terminals 5, and the first connection wiring 6 of the first portion A1 per unit area (e.g., per 1 mm$^2$ or per 1 cm$^2$) may be substantially the same as the percentage of the area (SR2) of the dummy conductors 7 per unit area of the second portion A2. SR1 and SR2 may have the relationship of, but is not limited to, 0.8≤SR1/SR2≤1.2.

The second portion A2 may be larger than or equal to the first portion A1 when the size (area) of the first portion A1 including the first wiring pads 4, the external connection terminals 5, and the first connection wiring 6 is compared with the size (area) of the second portion A2 including the dummy conductors 7. This structure increases the percentage of the area of the dummy conductors 7 with respect to the area of the second surface 2*b* of the substrate 2, thus allowing the second surface 2*b* of the substrate 2 to be flatter. This also improves the rigidity of the substrate 2 more uniformly across the second surface 2*b*, thus reducing bending of the substrate 2 in its natural state. This also improves the rigidity of the substrate 2 more uniformly across the substrate 2, thus further reducing changes of the substrate 2 such as bending when the substrate 2 is pressed on the first surface 2*a* in the mounting process of the light emitters 31. The percentage of the area of the second portion A2 with respect to the area of the second surface 2*b* of the substrate 2 may be greater than or equal to 50, 70, or 90%. The percentage of the area of the second portion A2 with respect to the area of the second surface 2*b* of the substrate 2 may be up to about 95%.

The substrate 2 is, for example, a transparent or opaque glass substrate. The substrate 2 includes the first surface 2*a*, the second surface 2*b* opposite to the first surface 2*a*, and a third surface (also referred to as a side surface) 2*c* connecting the first surface 2*a* and the second surface 2*b*. The substrate 2 may be, for example, a plastic substrate or a ceramic substrate. The substrate 2 may be a composite substrate including multiple substrates made of different materials stacked on one another.

The substrate 2 may be a triangular plate, a quadrangular plate such as a square plate or a rectangular plate, a trapezoidal plate, a pentagonal plate, a hexagonal plate, a circular plate, an oval plate, or a plate with any other shape. The substrate 2 being, for example, an equilateral triangular plate, a quadrangular plate, or a regular hexagonal plate facilitates tiling of multiple display devices 1 into a multi-display.

In the present embodiment, as illustrated in FIGS. 1 and 2, the substrate 2 is a rectangular plate. The second surface 2*b* of the substrate 2 includes a first side 2*ba*, a second side

2*bb*, a third side 2*bc*, and a fourth side 2*bd*. The second side 2*bb* is continuous with the first side 2*ba*. The third side 2*bc* is continuous with the second side 2*bb* and faces the first side 2*ba*. The fourth side 2*bd* is continuous with the first side 2*ba* and faces the second side 2*bb*.

The display 3 is located on the first surface 2*a* of the substrate 2. The display 3 includes multiple pixel units 3*p*. As illustrated in, for example, FIG. 1, the pixel units 3*p* are arranged in a matrix.

Each pixel unit 3*p* includes the light emitter 31, an electrode pad 32, and a drive circuit (not illustrated) for driving and controlling the light emitter 31. The drive circuit may include a thin-film transistor (TFT) and a capacitor. The TFT may include a semiconductor film (or a channel) of, for example, amorphous silicon (a-Si) or low-temperature polycrystalline silicon (LTPS). The TFT may include three terminals, or specifically, a gate electrode, a source electrode, and a drain electrode. The TFT serves as a switching element that switches conduction and non-conduction between the source electrode and the drain electrode based on the voltage applied to the gate electrode. The drive circuit may be formed using a thin film formation method such as chemical vapor deposition (CVD).

Each light emitter 31 is self-luminous. The self-luminous light emitter may be an LED or a semiconductor laser diode (LD). In the present embodiment, the light emitter 31 is an LED that is a two-terminal element including an anode electrode 31*a* and a cathode electrode 31*b*. The light emitter 31 may be a micro-LED. The light emitter 31 being a micro-LED located on the first surface 2*a* may be quadrangular in a plan view with each side having a length of about 1 to 100 μm inclusive or about 3 to 30 μm inclusive.

As illustrated in FIG. 3, the electrode pad 32 is connected to the light emitter 31 to provide drive signals to the light emitter 31. The electrode pad 32 includes an anode electrode pad 32*a* and a cathode electrode pad 32*b*. The anode electrode pad 32*a* and the cathode electrode pad 32*b* are each made of a conductive material. The anode electrode pad 32*a* and the cathode electrode pad 32*b* may each include a single metal layer or multiple metal layers stacked on one another. The anode electrode pad 32*a* and the cathode electrode pad 32*b* may include layers of, for example, Mo/Al/Mo or MoNd/AlNd/MoNd. Mo/Al/Mo indicates a structure including a Mo layer, an Al layer, and a Mo layer stacked in this order. The same applies to other notations. MoNd is an alloy of Mo and Nd. The same applies to other notations. The anode electrode pad 32*a* and the cathode electrode pad 32*b* may include surfaces coated with a transparent conductive layer 32*c* of, for example, indium tin oxide (ITO) or indium zinc oxide (IZO).

The anode electrode 31*a* of the light emitter 31 is electrically connected to the anode electrode pad 32*a* of the electrode pad 32. The cathode electrode 31*b* of the light emitter 31 is electrically connected to the cathode electrode pad 32*b* of the electrode pad 32. The anode electrode 31*a* may be electrically connected to the anode electrode pad 32*a*, and the cathode electrode 31*b* may be electrically connected to the cathode electrode pad 32*b*, each with a conductive bond such as an ACF or solder.

Each pixel unit 3*p* may include multiple light emitters 31, multiple anode electrode pads 32*a*, and one or more cathode electrode pads 32*b*. The multiple anode electrode pads 32*a* are electrically connected to the anode electrodes 31*a* of the respective light emitters 31. When each pixel unit 3*p* includes the multiple cathode electrode pads 32*b*, the cathode electrode pads 32*b* may be connected to the cathode electrodes 31*b* of the light emitters 31. When each pixel unit $3p$ includes one cathode electrode pad 32b, the cathode electrode pad 32b may be commonly connected to the cathode electrodes 31b of the light emitters 31. Each pixel unit $3p$ may include the multiple light emitters 31. The light emitters 31 may include a red light emitter that emits red light, a green light emitter that emits green light, and a blue light emitter that emits blue light. This allows each pixel unit $3p$ to display full-color gradation. Each pixel unit $3p$ may include, in place of the red light emitter, a light emitter that emits orange, red-orange, red-violet, or violet light. Each pixel unit $3p$ may include, in place of the green light emitter, a light emitter that emits yellow-green light.

The first wiring pads 4 are located on the second surface 2b. The first wiring pads 4 may be located at the periphery of the second surface 2b in a plan view. The periphery may have a width of about 30 to 150 μm. As illustrated in, for example, FIG. 2, the first wiring pads 4 in the present embodiment are located nearer the first side 2ba and the second side 2bb in a plan view.

The first wiring pads 4 are electrically connected to the display 3. In the present embodiment, the first wiring pads 4 are electrically connected to the display 3 with second wiring pads 8, side wires 9, and second connection wires 10 (described later). The first wiring pads 4 may be electrically connected to TFTs included in the pixel units $3p$, or may be electrically connected to the anode electrode pads 32a or the cathode electrode pads 32b.

The first wiring pads 4 contain a conductive material. Each first wiring pad 4 may include a single metal layer, or multiple metal layers stacked on one another. The first wiring pads 4 may include layers of, for example, Al, Al/Ti, Ti/Al/Ti, Mo, Mo/Al/Mo, MoNd/AlNd/MoNd, Cu, Cr, Ni, or Ag. In the example of FIG. 3, the first wiring pad 4 includes a single metal layer formed on the second surface 2b. The first wiring pads 4 may be partially covered with an insulating layer (also referred to as an overcoat layer) 6b of, for example, $SiO_2$, $Si_3N_4$, or a polymeric material such as an acrylic resin.

The external connection terminals 5 are located on the second surface 2b. The external connection terminals 5 may be electrode pads for providing emission control signals Sig to the pixel units $3p$, electrode pads for providing a power supply voltage to the pixel units $3p$, or other electrode pads for drive signals. The emission control signals Sig control the luminance of the pixel units $3p$. The power supply voltage may be a first power supply voltage Vdd and provided to the anode electrodes 31a of the light emitters 31 or may be a second power supply voltage Vss lower than the first power supply voltage Vdd and provided to the cathode electrodes 31b of the light emitters 31. The potential of the second power supply voltage Vss may be a ground potential. The external connection terminals 5 are connectable to a circuit board that outputs the emission control signals Sig or the first and second power supply voltages Vdd and Vss provided to the pixel units $3p$. The circuit board may be a flexible printed circuit (FPC) board including a drive element such as an IC for driving and controlling the pixel units $3p$ and circuit wiring.

The external connection terminals 5 contain a conductive material. The external connection terminals 5 may be made of the same or similar material and may have the same or similar layer structure as the first wiring pads 4.

The first connection wiring 6 is located on the second surface 2b. The first connection wiring 6 electrically connects the first wiring pads 4 and the external connection terminals 5. The first connection wiring 6 includes multiple first wiring conductors 61. Each wiring conductor 61 electrically connects a single first wiring pad 4 and a single external connection terminal 5. In a plan view, each wiring conductor 61 may linearly connect the single first wiring pad 4 and the single external connection terminal 5 or may each include at least one bent portion. For the first connection wiring 6 being wiring for providing a power supply voltage to the pixel units $3p$, a single wiring conductor 61 may electrically connect the multiple first wiring pads 4 and the single external connection terminal 5.

As illustrated in, for example, FIG. 2, the first wiring pads 4 and the external connection terminals 5 in the present embodiment are located nearer the first side 2ba and the second side 2bb in a plan view. In this case, the wiring length of the wiring conductor 61 connecting the first wiring pad 4 and the external connection terminal 5 can be reduced. This can reduce delays in the emission control signals Sig and round edges of the waveform of the emission control signals Sig or variations in a potential difference between the first power supply voltage Vdd and the second power supply voltage Vss caused by, for example, the electrical resistance of the wiring conductor 61 or by a parasitic capacitance between the wiring conductor 61 and another wiring conductor in the display device 1. This improves the image quality of the display device 1.

As illustrated in FIG. 3, the first connection wiring 6 includes a conductive layer 6a made of a conductive material. The conductive layer 6a may be made of the same or similar material and may have the same or similar layer structure as the first wiring pads 4. The first connection wiring 6 may further include the insulating layer (also referred to as the overcoat layer) 6b made of an insulating material. For example, the insulating layer 6b may cover the conductive layer 6a. The insulating layer 6b is made of, for example, $SiO_2$, $Si_3N_4$, or a polymeric material such as an acrylic resin. The insulating layer 6b may at least partially cover a surface other than the surface of the conductive layer 6a facing the substrate 2. This structure reduces the likelihood of short-circuiting between the wiring conductors 61.

The dummy conductor 7 is located on the second surface 2b. The dummy conductor 7 is located to overlap none of the first wiring pads 4, the external connection terminals 5, and the connection wiring 6 in a plan view. In other words, the dummy conductor 7 is located in the second portion A2 not including the first wiring pads 4, the external connection terminals 5, and the connection wiring 6 in a plan view. The dummy conductor 7 may be electrically insulated from the connection wiring 6. When the connection wiring 6 includes a ground wiring conductor 61 that receives a ground potential, the dummy conductor 7 may be electrically connected to the ground wiring conductor 61. This structure allows the larger dummy conductor 7 to stabilize a ground potential, thus improving the image quality of the display device 1. The dummy conductor 7 may be electrically floating. To achieve the same or similar effects, the dummy conductor 7 may be electrically connected to ground external connection terminals 5 or to electrically floating external connection terminals 5.

The dummy conductor 7 may include a conductor layer 7a made of a conductive material and an insulating layer (also referred to as an overcoat layer) 7b that covers the conductor layer 7a. The conductor layer 7a may be made of the same or similar material and may have the same or similar layer structure as the conductive layer 6a in the first connection wiring 6. The insulating layer 7b is made of, for example, $SiO_2$, $Si_3N_4$, or a polymeric material such as an acrylic resin. The insulating layer 7b may at least partially cover a surface other than the surface of the conductor layer 7a facing the substrate 2. In this case, the dummy conductor 7 functions as a protective layer and reduces the likelihood of short-circuiting with, for example, the first wiring pad 4, the external connection terminal 5, and the first connection wiring 6.

The display device 1 may be accommodated in a housing (not illustrated) with a heat-dissipating component such as a cooling fan and a heat-dissipating fin. In this case, the dummy conductor 7 may face or may be in contact with the heat-dissipating component. This effectively dissipates heat generated in the light emitters 31 outside, thus improving the image quality of the display device 1.

The display device 1 further includes multiple second wiring pads 8, multiple side wires 9, and multiple second connection wires 10.

The display device 1 including the side wires 9 is suitable for forming a composite display device (multi-display). More specifically, the display device 1 may include a smaller frame portion to have joints being less noticeable in the composite display device. When the multiple display devices 1 are tiled to one another into the composite display device, the front surface and the back surface of each display device 1 are electrically connected to each other with the side wire 9 made of, for example, Ag. One display device 1 and another display device 1 are joined (tiled) together on their adjacent side surfaces to form the composite display device. This structure achieves the continuity of a display image at the joint and allows a viewer to feel less discomfort in the display image and the joint to be less noticeable. The joining member that joins the side surfaces of the multiple display devices 1 together may be a resin adhesive, for example, a resin adhesive with a light-shielding color of, for example, black. The joining member may be a mechanical joining member such as a screw. The joining member may use fitting engagement between a protrusion on an end of one substrate 2 and a recess on an end of another substrate 2. The recess is complementary to the protrusion. The display devices 1 may be located on a base substrate. Each display device 1 may be fixed to the base substrate with a resin adhesive, or may be fitted into a frame fixed to the base substrate with the resin adhesive or screws.

As illustrated in, for example, FIG. 1, the second wiring pads 8 are located on the first surface 2a. Each second wiring pad 8 may at least partially overlap the first wiring pad 4 in a plan view. This structure is applicable to all the second wiring pads 8. As illustrated in, for example, FIG. 1, the second wiring pads 8 are electrically connected to the pixel units 3p in the display 3 with the second connection wires 10.

The second wiring pads 8 are made of a conductive material. The second wiring pads 8 may be made of the same or similar material and may have the same or similar layer structure as the first wiring pads 4. In the example of FIG. 3, the second wiring pad 8 includes a metal layer 82 and a metal layer 88 stacked on each other and is located on insulating layers 83 and 84 on the first surface 2a. The second wiring pad 8 also includes a back surface connected to a connection wire 81 electrically connected to, for example, a TFT and the light emitter 31.

As illustrated in, for example, FIG. 3, the second wiring pad 8 including the metal layers 82 and 88 stacked on each other may include an insulating layer 87 partially between the metal layers 82 and 88. The second wiring pad 8 may include insulating layers 85 and 86 on its inward end (right in FIG. 3). This reduces the likelihood of short-circuiting between the second wiring pad 8 and a wiring conductor or another element located inward. The insulating layers 83 to 87 are made of, for example, $SiO_2$, $Si_3N_4$, or a polymeric material such as an acrylic resin. The metal layer 88 nearer the surface of the second wiring pad 8 may be a transparent conductive layer of, for example, ITO or IZO.

The second connection wires 10 are located on the first surface 2a. Each second connection wire 10 may include, for example, layers of Mo/Al/Mo or MoNd/AlNd/MoNd. The second connection wires 10 may include scanning signal lines, image signal lines, or emission control signal lines connecting the TFTs included in the pixel units 3p and the second wiring pads 8. The second connection wires 10 may include power supply wires connecting the anode electrode pads 32a or the cathode electrode pads 32b to the second wiring pads 8. The anode electrode pads 32a or the cathode electrode pads 32b are connected to the second connection wires 10. The second connection wires 10 may include the anode electrode pads 32a or the cathode electrode pads 32b as parts of the second connection wires 10. The second connection wires 10 may have a linear or stripe conductor pattern, or a planar conductor pattern. The second connection wires 10 being power supply wires for the power supply voltage Vss and connecting the cathode electrode pads 32b to the second wiring pads 8 may have a planar conductor pattern.

The side wires 9 extend from the first surface 2a to the second surface 2b through the side surfaces 2c. Each side wire 9 connects the corresponding second wiring pad 8 and the corresponding first wiring pad 4.

The side wires 9 may include a conductive paste containing conductive particles of, for example, Ag, Cu, Al, or stainless steel, an uncured resin component such as an epoxy resin, an alcohol solvent such as ethyl alcohol, and water. The conductive paste may be applied to an intended portion from the side surfaces 2c to the first surface 2a and to the second surface 2b and cured by heating, photocuring using ultraviolet ray irradiation, or a combination of photocuring and heating. The side wires 9 may also be formed with a thin film formation method such as plating, vapor deposition, or CVD. The side surfaces 2c may include grooves preformed for the side wires 9. This allows the conductive paste for the side wire 9 to be easily received in the intended portion of the side surface 2c.

When the first wiring pads 4 are located at the periphery of the second surface 2b and the second wiring pads 8 are located at the periphery of the first surface 2a, the first wiring pads 4 and the second wiring pads 8 may at least partially overlap each other in a plan view. This structure is applicable to all the first wiring pads 4. This reduces the length of the side wires 9 connecting the first wiring pads 4 and the second wiring pads 8, thus reducing resistance. This also reduces the likelihood of short-circuiting caused by any side wire 9 coming in contact with, for example, another wiring pad or another wiring conductor in the display device 1.

The size (area) of the first wiring pad 4 located on the second surface 2b may be larger than the size (area) of the second wiring pad 8 located on the first surface 2a. The second wiring pads 8 are located on the frame around the display 3. The frame is to be as narrow as possible. The second wiring pads 8 thus cannot be larger. In particular, when the pixel pitch is smaller, the second wiring pads 8 cannot be larger. The first wiring pads 4 are located on the second surface 2b typically free from dimensional limitations. The first wiring pads 4 larger than the second wiring pads 8 reduce the contact resistance between the side wires 9 and the first wiring pads 4, thus improving the conductivity of signals transmitted through the side wires 9. The size of the first wiring pad 4 may be, but not limited to, more than one time and not more than about two times the size of the second wiring pad 8.

The first wiring pads 4 and the second wiring pads 8 can be connected with feedthrough conductors, such as through-holes, extending through the substrate 2 from the first surface 2a to the second surface 2b. To connect the first wiring pads 4 and the second wiring pads 8 with feedthrough conductors, for example, the substrate 2 is to have areas at its periphery for the feedthrough conductors and thus cannot easily have a frame portion (also referred to as a non-display portion) with a smaller area in the display device 1. With the first wiring pads 4 and the second wiring pads 8 connected to each other with the side wires 9, the display device 1 can easily have a frame portion with a smaller area.

In the present embodiment, the display device 1 includes the dummy conductor 7 not overlapping the first connection wiring 6 in a plan view. This structure allows the back surface of the substrate 2 to be flatter. In the mounting process of the light emitters 31 with the manufacturing method for the display device 1, both the first connection wiring 6 and the dummy conductor 7 can be in contact with the flat stage surface of the mounting apparatus. This reduces bending or deformation of the substrate 2 when the light emitters 31 are pressed against the substrate 2, thus reducing defective mounting of the light emitters 31. This improves the image quality and the manufacturing yield of the display device 1.

The first connection wiring 6 and the dummy conductor 7 may have the same height (thickness) from the second surface 2b. In this case, in the mounting process, both the first connection wiring 6 and the dummy conductor 7 can be in contact with the flat stage surface of the mounting apparatus in a reliable manner. This further reduces bending or deformation of the substrate 2 when the light emitters 31 are pressed against the substrate 2, thus further reducing defective mounting of the light emitters 31. This improves the image quality and the manufacturing yield of the display device 1. The height of the first connection wiring 6 from the second surface 2b refers to the height from the second surface 2b to the surface of the first connection wiring 6 opposite to the surface facing the substrate 2. The height of the dummy conductor 7 from the second surface 2b is defined in the same or similar manner.

The thickness of the first connection wiring 6 and the dummy conductor 7 may be, but not limited to, about 3 to 10 μm. With the insulating layer (also referred to as the overcoat layer) 6b covering the conductive layer 6a of the first connection wiring 6, the insulating layer 6b may have a thickness of, but is not limited to, about 5 to 15 μm.

The first wiring pads 4 and the dummy conductor 7 may have the same thickness. This further reduces bending or deformation of the substrate 2 when the light emitters 31 are pressed against the substrate 2, thus further reducing defective mounting of the light emitters 31. On the second surface 2b, a distance between each first wiring pad 4 located along the first side 2ba and the first side 2ba, a distance between each first wiring pad 4 located along the second side 2bb and the second side 2bb, a distance between the dummy conductor 7 and the third side 2bc, and a distance between the dummy conductor 7 and the fourth side 2bd may be substantially the same. This structure allows more uniform distribution of a film portion on the second surface 2b. This further reduces bending or deformation of the substrate 2 when the light emitters 31 are pressed against the substrate 2, thus further reducing defective mounting of the light emitters 31. Distances being substantially the same refer to, for example, distances being different from a reference distance by not more than about ±10%.

Each of the first connection wiring 6 and the dummy conductor 7 may have a greater height from the second surface 2b than a height of the first wiring pads 4 and a height of the external connection terminals 5 from the second surface 2b. In this case, the substrate 2 including, on the second surface 2b, the first wiring pads 4, the external connection terminals 5, the first connection wiring 6, and the dummy conductor 7 is placed on the flat stage surface of the mounting apparatus to allow both the first connection wiring 6 and the dummy conductor 7 to be in contact with the stage surface of the mounting apparatus in a reliable manner. This further reduces bending or deformation of the substrate 2 when the light emitters 31 are pressed against the substrate 2, thus further reducing defective mounting of the light emitters 31. This improves the image quality and the manufacturing yield of the display device 1. The height of the first wiring pads 4 from the second surface 2b refers to the height from the second surface 2b to the surface of each first wiring pad 4 opposite to the surface facing the substrate 2. The height of the external connection terminals 5 from the second surface 2b is defined in the same or similar manner. In the above structure, the first connection wiring 6 may include the insulating layer 6b on its surface, and the first wiring pads 4 and the external connection terminals 5 being electrical connectors may include no insulating layer 6b on their surfaces.

As illustrated in, for example, FIG. 2, the dummy conductor 7 may include a solid portion 71. The solid portion 71 may have a shape of, for example, a polygon, a circle, an oval, or an ellipse in a plan view. The polygon herein refers to, for example, a triangle, a quadrangle (a square or a rectangle), a pentagon, a hexagon, or an octagon. The dummy conductor 7 including the solid portion 71 can easily increase the ratio of the area of the dummy conductor 7 in a plan view with respect to the area of the second surface 2b in a plan view. This increases the percentage of the area supported by the stage surface on the second surface 2b when the light emitters 31 are pressed against the substrate 2 in the mounting process, and thus effectively reduces bending or deformation of the substrate 2 and effectively reduces defective mounting of the light emitters 31. This improves the image quality and the manufacturing yield of the display device 1.

As illustrated in, for example, FIG. 2, the solid portion 71 may be located nearer a corner 2d between the third side 2bc and the fourth side 2bd on the second surface 2b. In this structure, the first connection wiring 6 and the dummy conductor 7 extend in a wider area on the second surface 2b when the light emitters 31 are pressed against the substrate 2 in the mounting process, thus reducing the unevenness of a portion supported by the stage surface on the second surface 2b. This thus effectively reduces bending or deformation of the substrate 2 and effectively reduces defective mounting of the light emitters 31. This improves the image quality and the manufacturing yield of the display device 1.

As illustrated in, for example, FIG. 4, the solid portion 71 may be triangular. In this structure, the dummy conductor 7 can be located to include a portion along a large part of the third side 2bc and a portion along a large part of the fourth side 2bd on the second surface 2b, thus increasing the ratio of the area of the dummy conductor 7 in a plan view with respect to the area of the second surface 2b in a plan view. This effectively reduces bending or deformation of the substrate 2 when the light emitters 31 are pressed against the substrate 2 in the mounting process, and effectively reduces defective mounting of the light emitters 31. This improves the image quality and the manufacturing yield of the display device 1.

As illustrated in, for example, FIG. 5, multiple isolated portions (also referred to as small pieces) 74 of the dummy conductors 7 having a small area may be distributed in the second portion A2. Each isolated portion 74 may have a shape of, for example, a polygon, a circle, an oval, or an ellipse in a plan view. The isolated portions 74 may have the same shape, or at least one isolated portion 74 may have a shape different from the shapes of the other isolated portions 74.

The isolated portions 74 may include isolated portions (also referred to as side isolated portions) 74p facing the first portion A1 on the second surface 2b and along the third side 2bc and the fourth side 2bd. The side isolated portions 74p may be larger than the other isolated portions 74. In this structure, the total area of the first wiring pads 4, the external connection terminals 5, and the first connection wiring 6 densely located in the first portion A1 can approach the area of the side isolated portions 74p. This allows the first portion A1 to have rigidity similar to the rigidity of a portion including the side isolated portions 74p, and reduces deformation of the substrate 2 such as bending in its natural state. This also effectively reduces bending or deformation of the substrate 2 when the light emitters 31 are pressed against the substrate 2 in the mounting process, and effectively reduces defective mounting of the light emitters 31. The size of the side isolated portions 74p may be, but not limited to, more than one time and not more than about two times the size of the other isolated portions 74.

When the solid portion 71 is formed by, for example, screen printing to cover at least about a half of the area of the second surface 2b, the thickness of the solid portions 71 may vary easily. With the dummy conductor 7 including the solid portions 71, the dummy conductor 7 can have less variation in the thickness and be distributed on the second surface 2b in a wider area. This effectively reduces bending or deformation of the substrate 2 when the light emitters 31 are pressed against the substrate 2 in the mounting process, and effectively reduces defective mounting of the light emitters 31. This improves the image quality and the manufacturing yield of the display device 1.

The solid portions 71 such as the isolated portions 74 may be located to overlap at least one light emitter 31 in a plan view. In this structure, when the light emitters 31 are pressed against the substrate 2 in the mounting process, the solid portions 71 function as supports for the light emitters 31. The light emitters 31 thus easily receive a pressing force. This effectively reduces bending or deformation of the substrate 2 caused by the pressing force, thus effectively reducing defective mounting of the light emitters 31. This improves the image quality and the manufacturing yield of the display device 1. The solid portion 71 such a single isolated portion 74 may overlap a single light emitter 31 in a plan view. When the substrate 2 includes multiple light emitters 31, each light emitter 31 may overlap a single solid portion 71 in a plan view. In this structure, the light emitters 31 easily receive a pressing force. The solid portion 71 may have a larger area than the light emitters 31, and the solid portion 71 may include the light emitters 31 in a plan view. In this structure, the solid portion 71 effectively functions as a support for the light emitters 31. The light emitters 31 thus easily receive a pressing force. The area of the solid portion 71 may be, but not limited to, more than one time and not more than about five times the area of the light emitters 31.

As illustrated in, for example, FIG. 6, the dummy conductor 7 may include a stripe portion 72. The stripe portion 72 includes multiple stripe conductors 72a extending parallel to one another. As illustrated in, for example, FIG. 6, the stripe conductors 72a may extend in the longitudinal direction of the substrate 2 (the lateral direction in FIG. 6) or in a direction intersecting with the longitudinal direction of the substrate 2 (the lateral direction of the substrate 2 and the vertical direction in FIG. 6). With the dummy conductor 7 including the stripe portion 72, the dummy conductor 7 can have less variation in the thickness and be distributed on the second surface 2b in a wider area. This effectively reduces bending or deformation of the substrate 2 when the light emitters 31 are pressed against the substrate 2 in the mounting process, and effectively reduces defective mounting of the light emitters 31. This improves the image quality and the manufacturing yield of the display device 1.

The stripe conductors 72a adjacent to each other may have a pitch P2 substantially equal to a pixel pitch P1 of the display 3. The stripe conductors 72a may have a uniform (constant) interval g3. This allows each stripe conductor 72a in the stripe portion 72 to be located to overlap at least one light emitter 31 in a plan view. In this structure, when the light emitters 31 are pressed against the substrate 2 in the mounting process, the stripe portion 72 functions as a support for the light emitters 31. The light emitters 31 thus easily receive a pressing force. This effectively reduces bending or deformation of the substrate 2 caused by the pressing force, thus effectively reducing defective mounting of the light emitters 31. This improves the image quality and the manufacturing yield of the display device 1.

Figure 7:
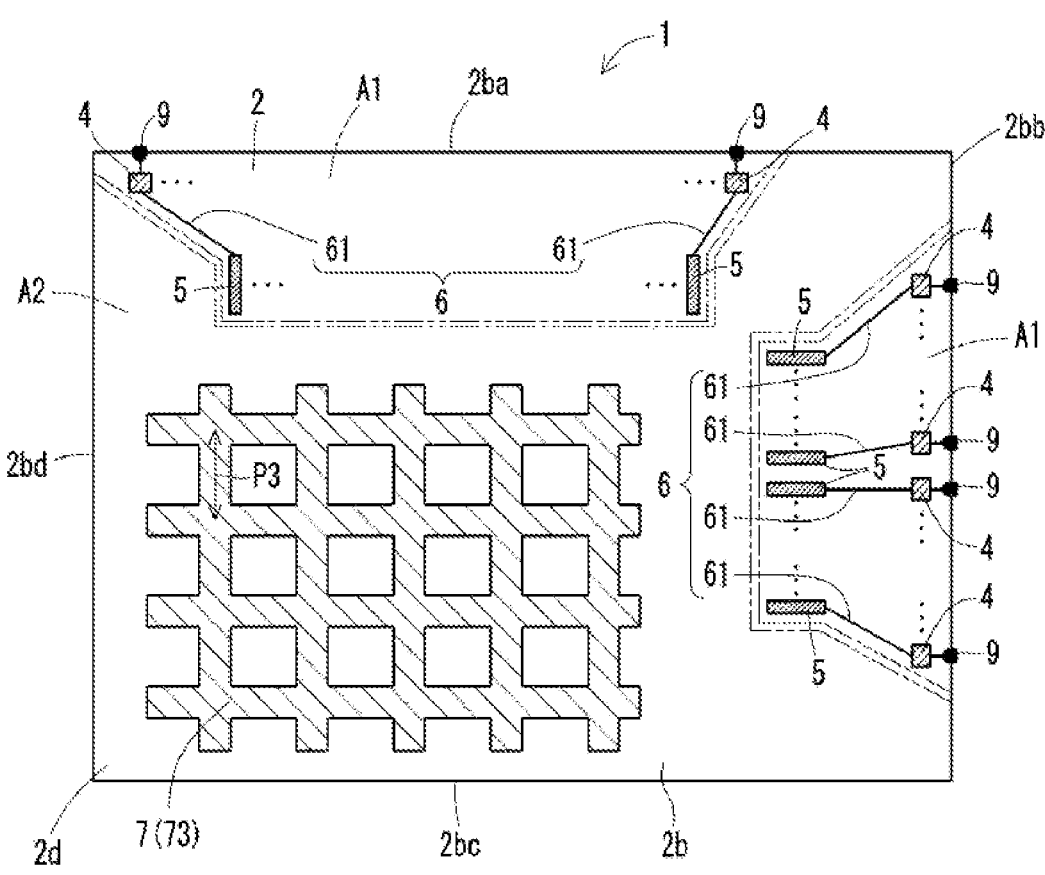
FIG. 7 is a schematic plan view of a display device according to another embodiment of the present disclosure, illustrating its circuit structure on a second surface of a substrate.

As illustrated in, for example, FIG. 7, the dummy conductor 7 may include a grid portion 73. With the dummy conductor 7 including the grid portion 73, the dummy conductor 7 can have less variation in the thickness and be distributed on the second surface 2b in a wider area. This effectively reduces bending or deformation of the substrate 2 when the light emitters 31 are pressed against the substrate 2 in the mounting process, and effectively reduces defective mounting of the light emitters 31. This improves the image quality and the manufacturing yield of the display device 1.

The grid portion 73 may have a grid pitch P3 substantially equal to the pixel pitch P1 of the display 3. This allows each grid point of the grid portion 73 to overlap a single light emitter 31 in a plan view. In this structure, when the light emitters 31 are pressed against the substrate 2 in the mounting process, the grid portion 73 functions as a support for the light emitters 31. The light emitters 31 thus easily receive a pressing force. This effectively reduces bending or deformation of the substrate 2 caused by the pressing force, thus effectively reducing defective mounting of the light emitters 31. This improves the image quality and the manufacturing yield of the display device 1.

Figure 11:
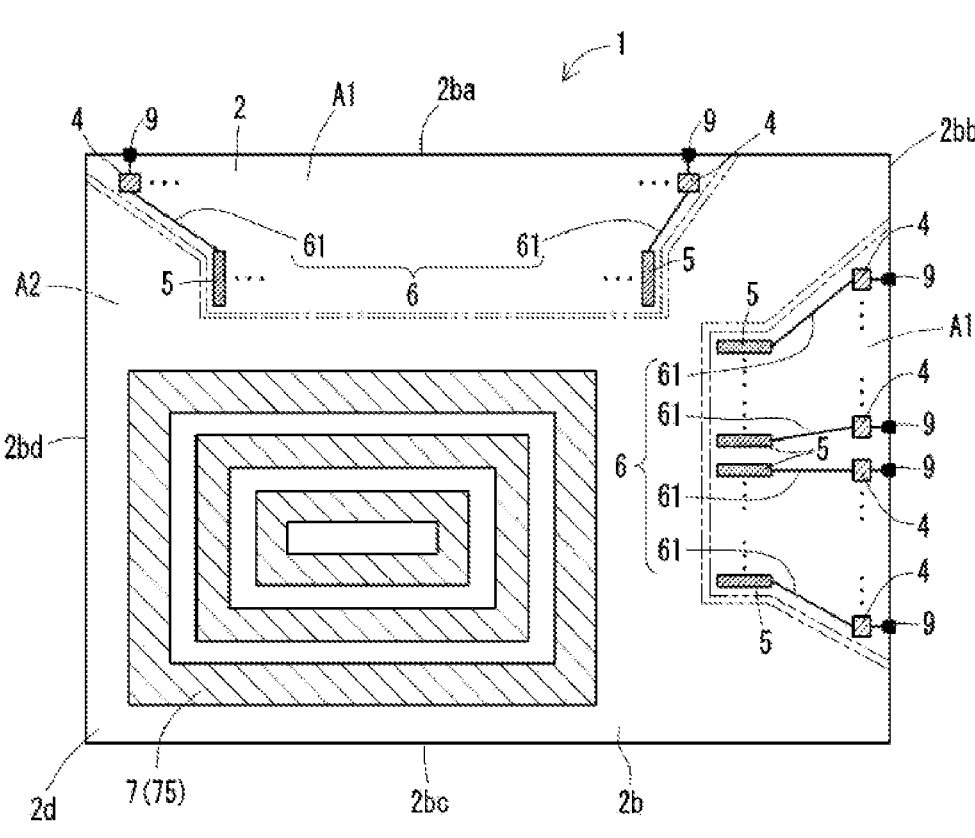
FIG. 11 is a schematic plan view of a display device according to another embodiment of the present disclosure, illustrating its circuit structure on a second surface of a substrate.

As illustrated in FIG. 11, the dummy conductor 7 may include a concentric loop portion 75. This structure allows the area of the dummy conductor 7 to be smaller than when the dummy conductor 7 includes the solid portion 71 (illustrated in FIG. 2). Similarly to the dummy conductor 7 being the solid portion 71, this structure also effectively reduces bending or deformation of the substrate 2 when the light emitters 31 are pressed against the substrate 2 in the mounting process of the light emitters 31, and effectively reduces defective mounting of the light emitters 31. The concentric loop portion 75 may include an outermost portion with an outer shape similar to the second surface 2b of the substrate 2. This easily distributes the pressing force for pressing the light emitters 31 against the substrate 2 uniformly in the mounting process of the light emitters 31.

In the display device 1, the area (area in a plan view) of the dummy conductor 7 may be 20 to 60% inclusive of the area (area in a plan view) of the second surface 2b in a plan view. When the area of the dummy conductor 7 is less than 20% of the area of the second surface 2b, bending or deformation of the substrate 2 may not be sufficiently reduced. When the area of the dummy conductor 7 is larger than 60% of the area of the second surface 2b, the thickness of the dummy conductor 7 may easily have variation in the thickness, and the first connection wiring 6 and the dummy conductor 7 may have a shorter distance between them. This may easily cause short-circuiting between the first connection wiring 6 and the dummy conductor 7. The dummy conductor 7 having an area in a plan view of 20 to 60% inclusive of the area of the second surface 2b in a plan view reduces variation in the thickness of the dummy conductor 7 and the likelihood of short-circuiting between the first connection wiring 6 and the dummy conductor 7 while reducing bending or deformation of the substrate 2.

Figure 8:
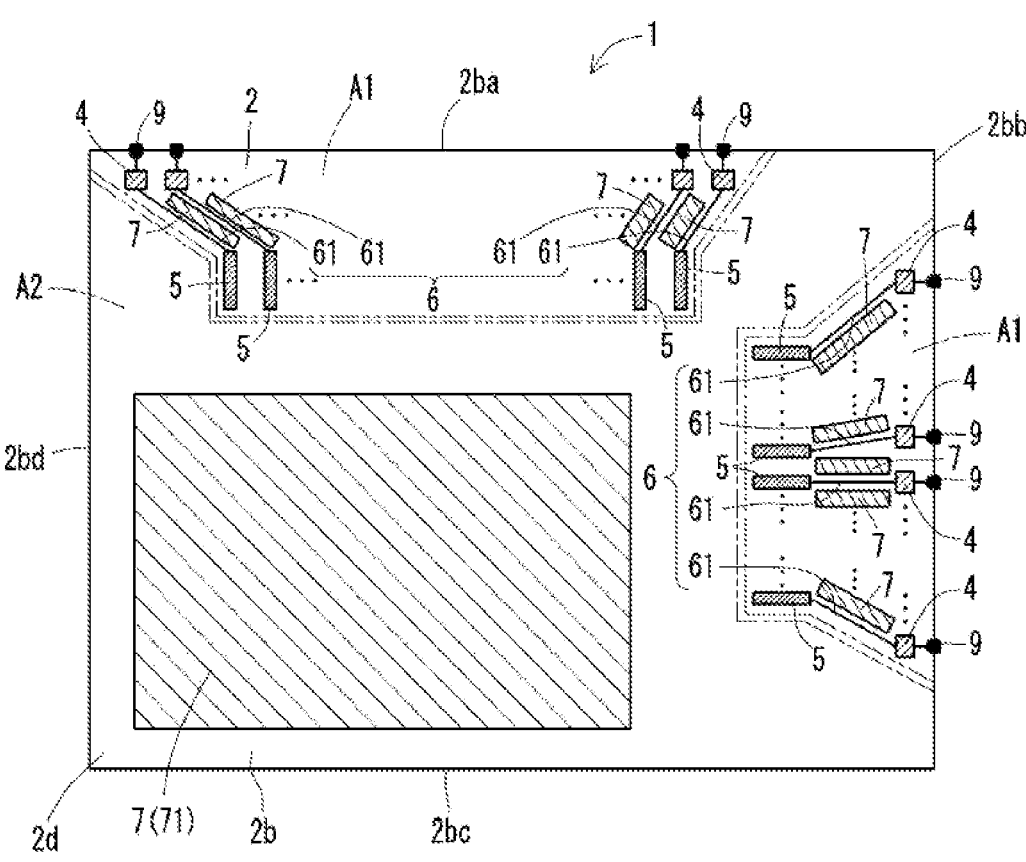
FIG. 8 is a schematic plan view of a display device according to another embodiment of the present disclosure, illustrating its circuit structure on a second surface of a substrate.

As illustrated in, for example, FIG. 8, the dummy conductor 7 may be located between adjacent wiring conductors 61. In this structure, the first connection wiring 6 and the dummy conductor 7 can be substantially uniformly distributed in portions including them on the second surface 2b. This effectively reduces bending or deformation of the substrate 2 when the light emitters 31 are pressed against the substrate 2 in the mounting process and effectively reduces defective mounting of the light emitters 31. This improves the image quality and the manufacturing yield of the display device 1.

Figure 12:
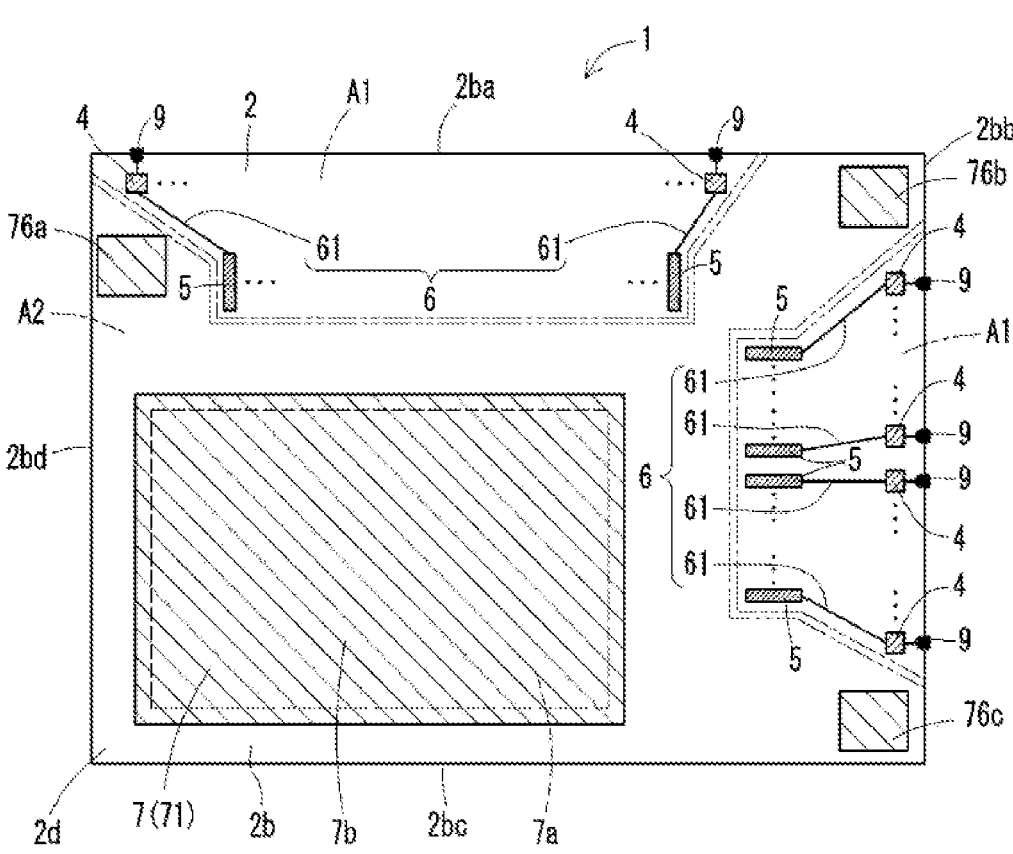
FIG. 12 is a schematic plan view of a display device according to another embodiment of the present disclosure, illustrating its circuit structure on a second surface of a substrate.

As illustrated in FIG. 12, the second surface 2b of the substrate 2 is polygonal, such as being quadrangular. The dummy conductor 7 may include portions 76a, 76b, and 76c located at the corners of the second surface 2b (also referred to as corner dummy conductors). This structure more effectively reduces bending or deformation of the substrate 2 when the light emitters 31 are pressed against the substrate 2 in the mounting process, and more effectively reduces defective mounting of the light emitters 31. The corner dummy conductors 76a, 76b, and 76c may be located at one or more corners of the second surface 2b or at all corners. When the second surface 2b includes multiple corner dummy conductors 76a, 76b, and 76c, the conductors may have the same shape and the same area. This easily distributes the pressing force for pressing the light emitters 31 against the substrate 2 uniformly in the mounting process of the light emitters 31 across the second surface 2b. The corner dummy conductors 76a, 76b, and 76c may be, for example, circular, oval, triangular, quadrangular, pentagonal, or in other polygonal shapes, or L-shaped. The corner dummy conductors 76a, 76b, and 76c may have a shape similar to the shape of the second surface 2b. This easily distributes the pressing force for pressing the light emitters 31 against the substrate 2 uniformly in the mounting process of the light emitters 31 across the second surface 2b.

Figure 13:
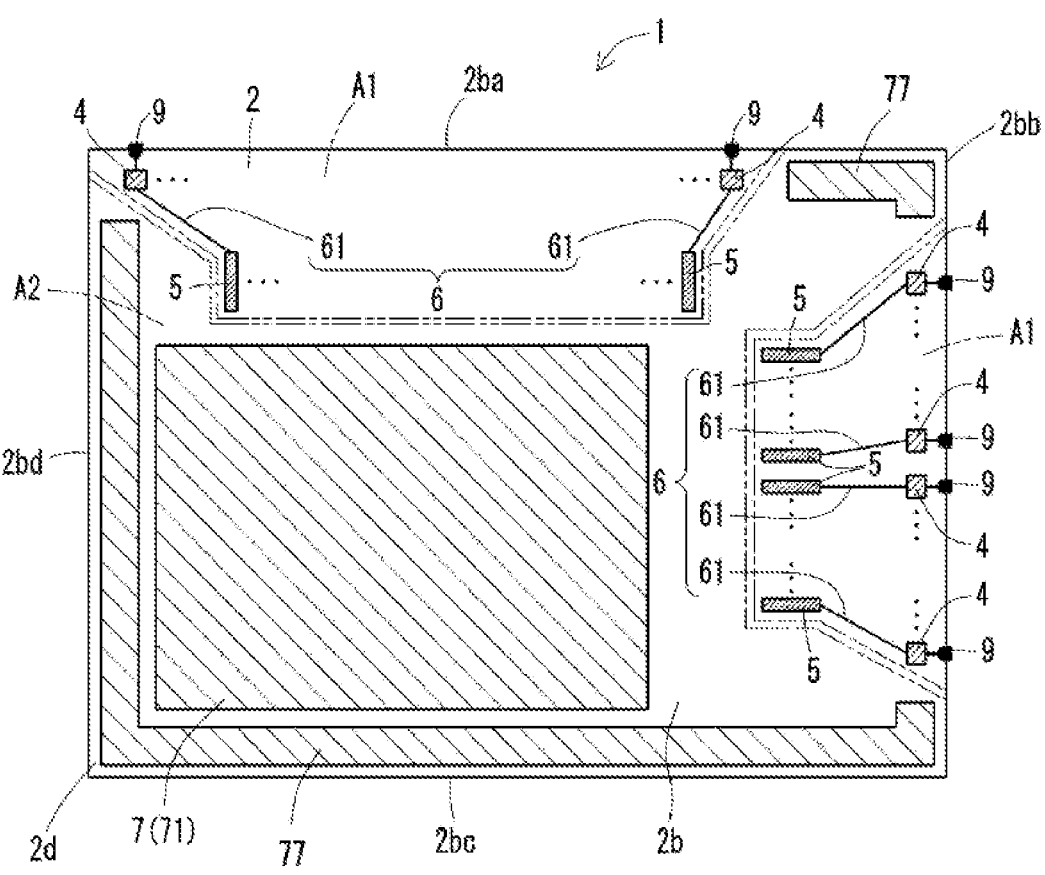
FIG. 13 is a schematic plan view of a display device according to another embodiment of the present disclosure, illustrating its circuit structure on a second surface of a substrate.

As illustrated in FIG. 13, the dummy conductor 7 may include a portion 77 located along the edges of the second surface 2b (also referred to as an edge dummy conductor). This structure more effectively reduces bending or deformation of the substrate 2 when the light emitters 31 are pressed against the substrate 2 in the mounting process of the light emitters 31, and more effectively reduces defective mounting of the light emitters 31.

The components of the display device 1 may have the shape and dimensions with the values and ranges described below, but the shape and dimensions are not limited to these values and ranges. The substrate 2 may be, for example, a square with each side having a length of about 10 to 1000 mm. A pressure plate for pressing the substrate 2 may be a square with each side longer than or equal to the substrate 2. The pressure of the pressure plate may be about 10 to 100 Mpa. The temperature during heat bonding of an ACF may typically be at about 150 to 200° C. The dummy conductors 7 being striped may each have a width of about 1 to 10 mm and an interval of about 1 to 20 mm between them.

EXAMPLES

Figure 9:
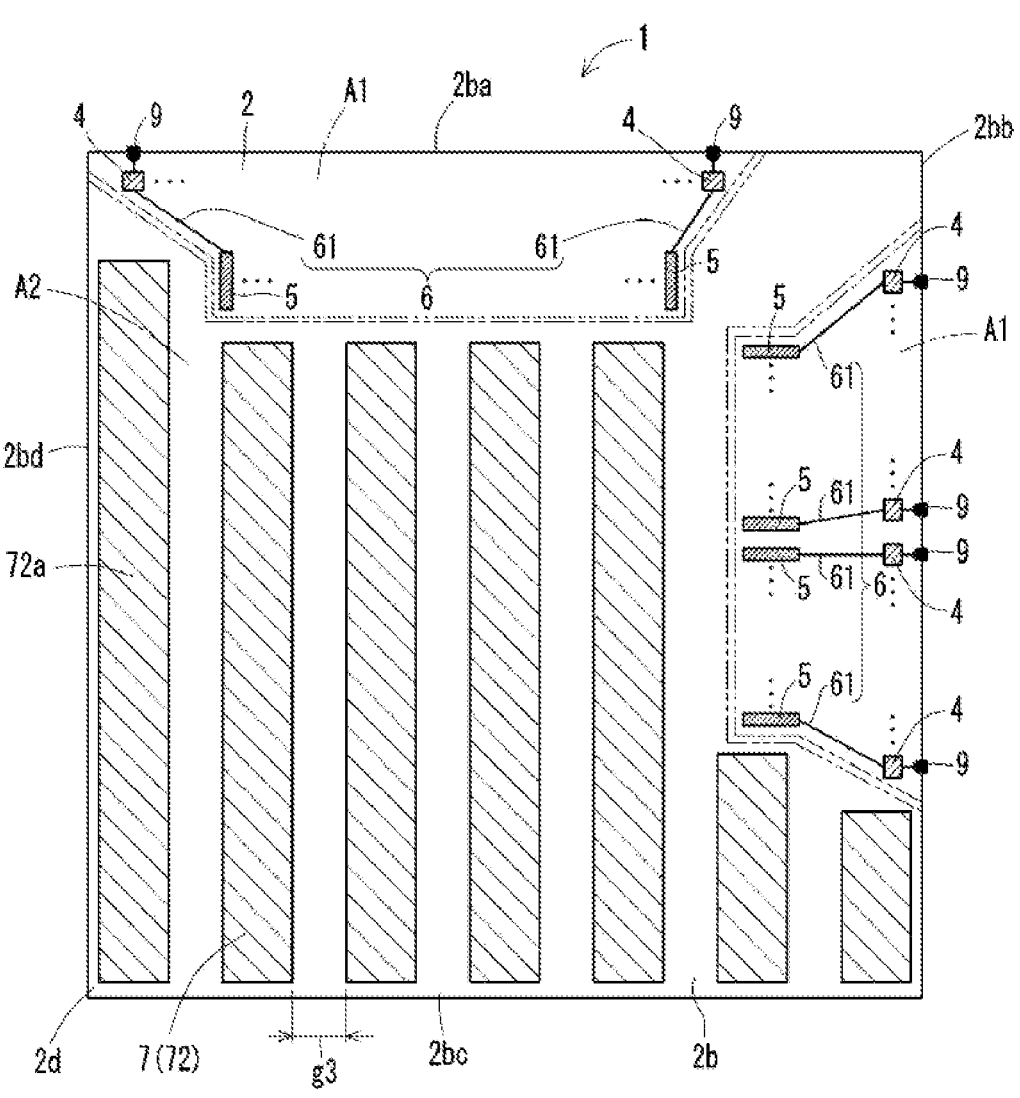
FIG. 9 is a schematic plan view of a display device according to another embodiment of the present disclosure, illustrating its circuit structure on a second surface of a substrate.
Figure 10:
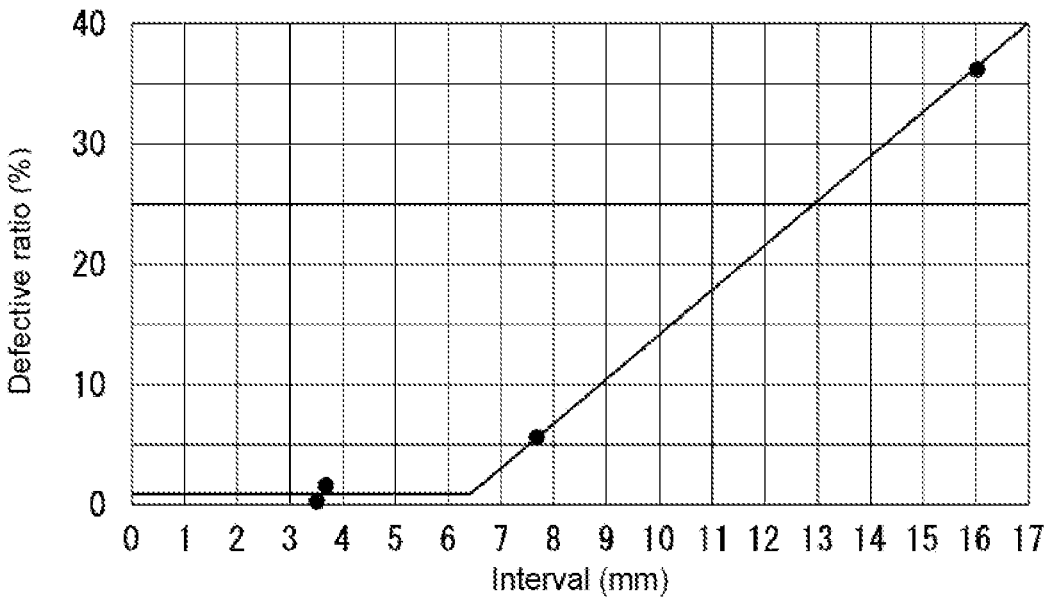
FIG. 10 is a graph showing the relationship between the interval between adjacent dummy conductors and the defec-tive ratio of mounting of light emitters in a display device according to an example of the present disclosure.

Multiple display device precursors were first manufactured with the same or similar structure as the display device 1 illustrated in FIG. 9, except that the display device precursors include no light emitters 31. In the display device 1 in FIG. 9, the substrate 2 is a square with each side having a length of 60 mm, and the dummy conductor 7 includes multiple vertical stripe portions 72. The stripe conductors 72a that form the stripe portions 72 are uniformly distributed in the second portion A2. Each stripe conductor 72a has a width of 5 mm and a uniform interval g3 with the adjacent stripe conductor 72a. The dummy conductor 7 has an area of about 70% of the area of the second portion A2. The multiple display device precursors each have different intervals g3 between adjacent stripe conductors 72a with the interval g3 varying from 3.5 to 16 mm. The pressure plate for pressing the substrate 2 is a square with each side having a length of 100 mm and the pressing force of about 70 Mpa.

The display device precursor was placed on the stage surface with the second surface 2b of the substrate 2 facing the stage surface of the mounting apparatus. The light emitters (micro LEDs) 31 were placed on the electrode pads 32 with an ACF. With the ACF being heated, the light emitters 31 were pressed against the substrate 2 by the pressure plate, and the light emitters 31 were mounted on the display device precursor to manufacture the display device 1.

The number of light emitters 31 with mounting defects was counted by detecting the luminance value of light emitted from the light emitters 31 while a predetermined emission control signal Sig, the first power supply voltage Vdd, and the second power supply voltage Vss were supplied to the external connection terminals 5. FIG. 10 is a graph showing the measured percentage of the number of light emitters 31 with mounting defects (also referred to as the defective ratio) with respect to the total number of light emitters 31. The structure in the present example includes 1000 light emitters 31 in total. In the present example, the height difference between a portion including the dummy conductor 7 and a portion including no dummy conductor 7 was set to 4 to 12 The horizontal axis in FIG. 10 indicates the interval g3 between the adjacent dummy conductors 7, and the vertical axis in FIG. 10 indicates the defective ratio. In FIG. 10, the solid circles each indicate the measured defective ratio, and the solid line approximates the measured defective ratios.

As illustrated in FIG. 10, when the interval between the adjacent dummy conductors 7 is less than or equal to about 6.5 mm, the defective ratio is less than or equal to 0.1%. In a comparative example, display devices that are the same as or similar to the display device 1 in the example except including no dummy conductor 7 were prepared. The defective ratio was then measured. The defective ratio exceeded the defective ratio of 50% in certain cases.

In one or more embodiments of the present disclosure, the display device allows the second surface of the substrate to be flatter. The display device also improves the rigidity of the substrate and reduces changes of the substrate such as bending. The light emitters pressed against the substrate in the mounting process are pressed uniformly at a predetermined pressure. This can reduce defective mounting of the light emitters, thus improving the image quality and the manufacturing yield of the display device.

Although the embodiments of the present disclosure have been described in detail, the present disclosure is not limited to the embodiments described above, and may be changed or varied in various manners without departing from the spirit and scope of the present disclosure. The components described in the above embodiments may be entirely or partially combined as appropriate unless any contradiction arises.

INDUSTRIAL APPLICABILITY

The display device according to one or more embodiments of the present disclosure can be used in various electronic devices. Such electronic devices include automobile route guidance systems (car navigation systems), ship route guidance systems, aircraft route guidance systems, indicators for instruments in vehicles such as automobiles, instrument panels, smartphones, mobile phones, tablets, personal digital assistants (PDAs), video cameras, digital still cameras, electronic organizers, electronic books, electronic dictionaries, personal computers, copiers, terminals for game devices, television sets, product display tags, price display tags, programmable display devices for industrial use, car audio systems, digital audio players, facsimile machines, printers, automatic teller machines (ATMs), vending machines, medical display devices, digital display watches, smartwatches, guidance display devices installed in stations or airports, and signage (digital signage) for advertisement.

REFERENCE SIGNS 1 display device
2 substrate
2a first surface
2b second surface
2ba first side
2bb second side
2bc third side
2bd fourth side
2c third surface (side surface)
2d corner
3 display
3p pixel unit
31 light emitter
31a anode electrode
31b cathode electrode
32 electrode pad
32a anode electrode pad
32b cathode electrode pad
32c transparent conductive layer
4 first wiring pad
5 external connection terminal
6 connection wiring (first connection wiring)
6a conductive layer
6b insulating layer
61 wiring conductor
7 dummy conductor (protrusion)

7a conductive layer
7b insulating layer
71 solid portion
72 stripe portion
72a stripe conductor
73 grid portion
74 isolated portion
74p isolated portion (side isolated portion)
75 concentric loop portion
76a, 76b, 76c corner dummy conductor
77 edge dummy conductor
8 second wiring pad
81 connection wire
82, 88 metal layer
83, 85, 87 insulating layer
9 side wire
10 second connection wire

The invention claimed is:

1. A display device, comprising:
a substrate including a first surface and a second surface opposite to the first surface;
a display on the first surface;
a first wiring pad on the second surface, the first wiring pad being electrically connected to the display;
an external connection terminal on the second surface;
connection wiring on the second surface, the connection wiring electrically connecting the first wiring pad and the external connection terminal; and
a protrusion on the second surface, the protrusion overlapping none of the first wiring pad, the external connection terminal, and the connection wiring in a plan view.

2. The display device according to claim 1, wherein the substrate includes, on the second surface, a first portion including the first wiring pad, the external connection terminal, and the connection wiring, and a second portion other than the first portion, and the protrusion is located in the second portion and has an area of at least a half of an area of the second portion.

3. The display device according to claim 2, wherein the protrusion comprises a plurality of protrusions, and the plurality of protrusions are uniformly distributed on the second portion.

4. The display device according to claim 3, wherein adjacent protrusions of the plurality of protrusions are at an interval of a predetermined value or less, and the connection wiring and a protrusion of the plurality of protrusions closest to the connection wiring are at an interval of the predetermined value or less.

5. The display device according to claim 1, wherein the protrusion is a dummy conductor.

6. The display device according to claim 1, wherein the protrusion includes at least a surface layer comprising a material having a lower hardness than a hardness of the first wiring pad, a hardness of the external connection terminal, and a hardness of the connection wiring.

7. The display device according to claim 6, wherein the protrusion includes the at least the surface layer comprising a resin material.

8. The display device according to claim 7, wherein the resin material is elastic.

9. The display device according to claim 1, wherein the protrusion includes at least one of an isolated portion, a solid portion, a stripe portion, or a grid portion.

10. The display device according to claim 1, wherein the protrusion includes a concentric loop portion.

11. The display device according to claim 1, wherein the second surface of the substrate is polygonal, and the protrusion includes a portion located at a corner of the second surface.

12. The display device according to claim 1, wherein the protrusion has an area of 20 to 60% inclusive of an area of the second surface.

13. The display device according to claim 1, wherein each of the connection wiring and the protrusion has a greater height from the second surface than a height of the first wiring pad and a height of the external connection terminal from the second surface.

14. The display device according to claim 13, wherein the connection wiring and the protrusion have an equal height from the second surface.

15. The display device according to claim 1, wherein the display incudes a plurality of pixel units arranged in a matrix, the plurality of pixel units includes light emitters, and the protrusion overlaps at least one light emitter of the light emitters in a plan view.

16. The display device according to claim 15, wherein the light emitters include micro-light-emitting diodes.

17. The display device according to claim 1, further comprising:

a second wiring pad on the first surface, the second wiring pad being electrically connected to the display; and a side wire extending from the first surface through a third surface to the second surface, wherein the third surface connects the first surface and the second surface; and the side wire connects the first wiring pad and the second wiring pad.

\* \* \* \* \*